US006273951B1

(12) United States Patent
Vaartstra

(10) Patent No.: US 6,273,951 B1
(45) Date of Patent: Aug. 14, 2001

(54) PRECURSOR MIXTURES FOR USE IN PREPARING LAYERS ON SUBSTRATES

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/334,153

(22) Filed: Jun. 16, 1999

(51) Int. Cl.$^7$ ............................... C30B 25/02; C06F 5/00
(52) U.S. Cl. ..................... 117/104; 117/89; 117/99; 546/2; 556/112
(58) Field of Search ............... 117/89, 104, 99; 546/2; 556/112

(56) References Cited

U.S. PATENT DOCUMENTS

| | | | |
|---|---|---|---|
| 4,975,299 | * 12/1990 | Mir et al. .................. | 117/104 |
| 5,124,278 | * 6/1992 | Bohling et al. ................. | 117/104 |
| 5,453,494 | 9/1995 | Kirlin et al. . | |
| 5,744,198 | * 4/1998 | Hampden-Smith et al. ..... | 427/376.6 |
| 5,772,757 | * 6/1998 | Saito ........................ | 117/104 |
| 5,840,897 | * 11/1998 | Kirlin et al. .................. | 546/2 |
| 5,980,983 | * 11/1999 | Gordon ..................... | 427/226 |
| 5,997,639 | * 12/1999 | Iyer ......................... | 117/104 |
| 6,004,392 | * 12/1999 | Isobe et al. ................. | 117/104 |
| 6,030,454 | * 2/2000 | Roeder et al. ............... | 117/104 |
| 6,090,963 | * 7/2000 | Zhuang et al. .............. | 556/112 |

OTHER PUBLICATIONS

Gardiner et al., "Mononuclear Barium Diketonate Polyamine Adducts. Synthesis, Structures, and Use in MOCVD of Barium Titanate," *Chem. Mater.*, 6:1967–1970 (1994).
Gordon et al., "New Liquid Precursors for Chemical Vapor Deposition," MSB Meeting, 6 pgs. (Fall 1997).
Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of the American Ceramic Society*, 78:2763–2768 (1995).

* cited by examiner

*Primary Examiner*—Robert Kunemund
(74) *Attorney, Agent, or Firm*—Mueting, Raasch & Gebhardt, P.A.

(57) ABSTRACT

Methods of forming a layer on a substrate using complexes of Formula I. The complexes and methods are particularly suitable for the preparation of semiconductor structures. The complexes are of the formula $L_yMY_z$ (Formula I) wherein: M is a metal; each L group is independently a neutral ligand containing one or more Lewis-base donor atoms; each Y group is independently an anionic ligand; y=a nonzero integer; and z=a nonzero integer corresponding to the valence state of the metal.

28 Claims, 3 Drawing Sheets

PRECURSOR MIXTURES FOR USE IN PREPARING LAYERS ON SUBSTRATES

FIELD OF THE INVENTION

This invention relates to precursor mixtures for the preparation of layers on substrates, particularly layers on semiconductor device structures. Specifically, such mixtures are particularly suitable for forming layers, such as metal oxide layers, especially barium-strontium-titanate (BST) layers.

BACKGROUND OF THE INVENTION

Capacitors are the basic energy storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs).

High quality thin oxide layers of metals, such as barium-strontium-titanates and strontium-bismuth-tantalates, for example, deposited on semiconductor wafers have recently gained interest for use in memory devices. These materials have very high dielectric constants and excellent resistance to fatigue. They also have suitable properties for a variety of other uses, such as electrooptic materials, pyroelectric materials, and antireflective coatings.

Suitable metal oxides are typically delivered to a substrate in the vapor phase; however, many oxides are difficult to deliver using vapor deposition technology. Many precursors are sensitive to thermal decomposition. Also, many precursors have vapor pressures that are too low for effective vapor deposition.

Thus, there is a continuing need for methods and materials for the formation of layers on substrates. This is particularly true for the formation of metal oxide layers, as well as other layers, on semiconductor structures, particularly random access memory devices, using vapor deposition processes. There is a particular need for methods that use volatile liquid precursors of low valent metals, which are suitable for use in vapor deposition processes without undue particle formation.

SUMMARY OF THE INVENTION

The present invention is directed to precursor mixtures and methods for forming metal-containing layers on substrates, such as semiconductor substrates or substrate assemblies during the manufacture of semiconductor structures, particularly memory devices. The method involves forming a layer using a precursor mixture of two or more complexes of the formula:

$$L_y MY_z,\qquad \text{(Formula I)}$$

wherein: M is a metal (main group, transition metal, or lanthanide); each L group is independently a neutral ligand containing one or more Lewis-base donor atoms (e.g., O, S, N, P, As, Se, or halogen); each Y group is independently an anionic ligand; y=a nonzero integer; and z=a nonzero integer corresponding to the valence state of the metal. It is further required that there are at least two different L groups present in the mixture, whether they be in the same complex (e.g., $L'_x L''_{y-x} MY_z$) or different complexes (e.g., $L'_y MY_z$ plus $L''_y MY_z$).

Typically and preferably, the layer is a metal-containing, and more preferably a dielectric metal-containing, material.

The metal-containing film can be a single metal or a metal alloy containing a mixture of metals. The metal-containing layer can also be an oxide, sulfide, selenide, telluride, nitride, or combination thereof, for example. Preferably, the layer is a metal-containing oxide layer. The layer can be used as a dielectric layer in an integrated circuit structure, particularly in a memory device such as a ferroelectric memory device.

The methods of the present invention involve vaporizing a precursor composition (i.e., precursor mixture) comprising two or more complexes of Formula I and directing it toward a substrate, such as a semiconductor substrate or substrate assembly, (preferably, using a chemical vapor deposition technique) to form a metal-containing layer on a surface of the substrate. Preferably, the metal of the complexes of Formula I is selected from the group of the Group IA (i.e., Group 1), Group IIA (i.e., Group 2) metals, the Group IVB (i.e., Group 4) metals, the Group VA (i.e., Group 15), and the Group VB (i.e., Group 5) metals. More preferably, the complexes include a metal selected from the group of Ba, Sr, Ti, Nb, and Ta. Particularly preferred metals M include Ba and Sr.

Preferably, the neutral ligand L of Formula I is selected from the group of polyamines, polyethers, aminoalcohols, ether-alcohols, and the like. Each complex can include various combinations of L groups. More preferably, the neutral ligand is selected from the group of alkyl-substituted polyamines.

Preferably, the anionic ligand Y of Formula I is selected from the group of carboxylates, ketoiminates, amidinates, diketonates, diiminates, and the like. Each complex can include various combinations of Y groups. More preferably, the anionic ligand is selected from the group of diketonates and ketoiminates.

The complexes of Formula I are neutral complexes, which are preferably liquids at room temperature. Preferably, precursor mixtures of the present invention include two or more complexes of Formula I that are miscible liquids. More preferably, they are miscible liquids at room temperature. As used herein, "miscible liquids" are complexes in the liquid phase (whether at room temperature or an elevated temperature) that are substantially uniformly dissolved in each other such that only one phase is observed by the human eye.

Methods of the present invention are particularly well suited for forming layers (i.e., films) on a surface of a semiconductor substrate or substrate assembly, such as a silicon wafer, with or without layers or structures formed thereon, used in forming integrated circuits. For example, the methods can involve manufacturing a memory device by providing a substrate having a first electrode thereon, vaporizing a precursor composition and directing it toward the substrate to form a dielectric layer comprising an oxide layer on the first electrode of the substrate, and forming a second electrode on the dielectric layer.

It is to be understood that methods of the present invention are not limited to deposition on silicon substrates, such as silicon wafers; rather, other types of wafers (e.g., gallium arsenide wafer, etc.) can be used as well. Also, methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A particularly preferred embodiment of the present invention is a method of forming a layer using a liquid precursor composition. The liquid precursor composition includes two or more complexes of Formula I. The method involves vaporizing the precursor composition to form vaporized precursor composition; and directing the vaporized precursor composition toward the substrate to form a layer on the substrate. Herein, vaporized precursor composition includes vaporized molecules of complexes of Formula I described herein either alone or optionally with vaporized molecules of other compounds in the precursor composition, including solvent molecules, if used.

The present invention further provides a chemical vapor deposition precursor composition comprising two or more complexes of Formula I described herein. Preferably, these complexes are liquids miscible with each other.

DETAILED DESCRIPTION OF PREFERRED EMBODIMENTS

Figure 1:
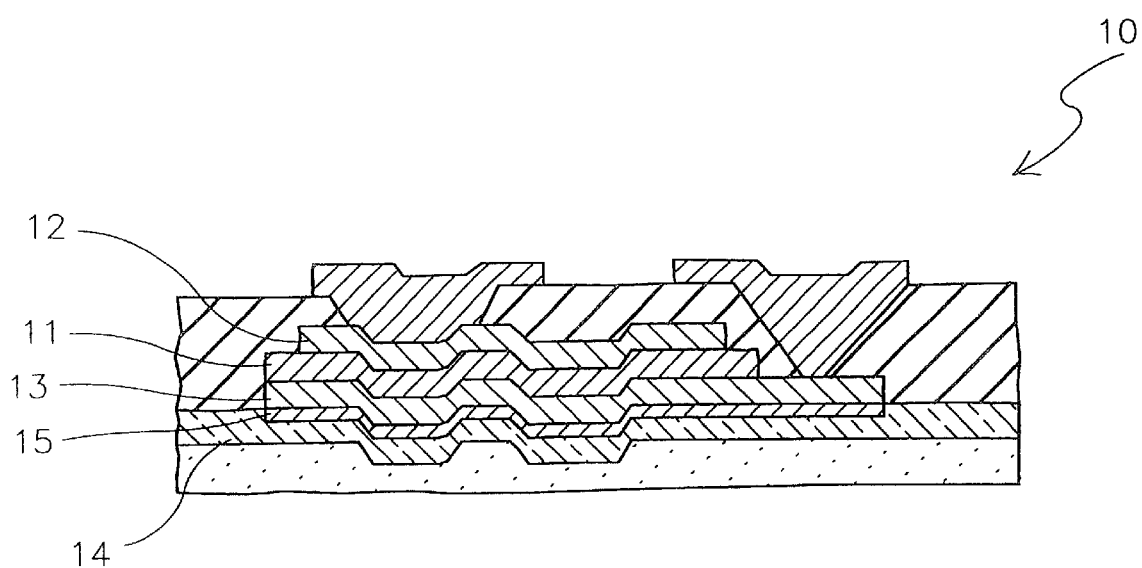
FIG. 1 is a cross-sectional schematic of a thin film ferroelectric memory device having a ferroelectric oxide layer between the electrodes.

The present invention provides a method of forming a layer (preferably, an oxide layer) using two or more complexes of the formula:

$$L_yMY_z \quad \text{(Formula I)}$$

wherein: M is a metal (main group, transition metal, or lanthanide); each L group is independently a neutral ligand containing one or more Lewis-base donor atoms (e.g., O, S, N, P, As, Se, or halogen); each Y group is independently an anionic ligand; y=a nonzero integer (preferably, y=1–3); and z=a nonzero integer corresponding to the valence state of the metal (preferably, z=1–2).

Preferably, the complexes of Formula I are mononuclear (i.e., monomers) and display few intermolecular forces of attraction. Thus, they are preferably volatile (or sublimable) and transportable in the gas phase. The complexes of Formula I are neutral complexes, which are preferably liquids at room temperature. Preferably, precursor mixtures of the present invention include two or more complexes of Formula I that are miscible liquids (preferably, miscible liquids at room temperature). This allows for complexes that are solid at room temperature, but that form miscible liquid mixtures at an elevated temperature. Thus, the complexes described herein are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 200° C. to about 600° C.

Methods of the present invention involve vaporizing a liquid precursor composition that includes two or more miscible liquids of Formula I. If more than one metal is desired in the resulting metal-containing layer (i.e., if a metal alloy layer is desired), the precursor composition includes complexes of Formula I containing different metals or other commonly used CVD precursor complexes containing the desired metal.

Methods of the present invention are particularly suitable for forming films containing low valent metals, such as barium, strontium, calcium, etc., which are extremely useful in the preparation of materials such as BST (a high dielectric capacitor material), and SBT (strontium bismuth tantalate). Prior to the methods of the present invention it has been extremely difficult to form such materials because precursor molecules tend to aggregate, which translates into poor volatility. For example, one of the most feasible complexes for barium deposition is a sterically bulky diketonate $Ba(thd)_2$, which is a solid, requires a temperature of about 250° C. to vaporize, and even then tends to decompose. In order to prohibit aggregation of molecular species it is known (Gardiner, R. A. et al., *Chem. Mater.*, 6, 1967 (1994)) that neutral additives containing donor atoms will stabilize monomeric $Ba(thd)_2L$ complexes, and as such will enhance volatility. However, the products are still solids, and even when dissolved in solvents run the risk of crystallizing out in parts of a vaporizer or CVD reactor.

Significantly, the methods of the present invention prevent the formation of, or at least reduce the occurrence of, such solid products. The use of mixtures of similar species helps reduce the formation of solid products, as does the use of neutral ligands that prevent crystallization and promote liquefaction of the precursor complexes.

In the methods of the present invention, the precursor compositions can be vaporized in the presence of a gas, which can be inert (i.e., a carrier gas) or reactive with the complexes of Formula I (i.e., a reaction gas), to form a layer. The carrier gas can be selected from a wide variety of gases that are generally unreactive with the complexes of Formula I described herein and do not interfere with the formation of a metal-containing layer. Examples include nitrogen, helium, argon, and mixtures thereof. The reaction gas can be selected from a wide variety of gases reactive with the complexes of Formula I, at least at a substrate surface under the conditions of chemical vapor deposition. Examples of reaction gases include oxygen, ozone, nitrogen oxides, ammonia, hydrazine, water vapor, hydrogen sulfide, hydrogen selenide, and hydrogen telluride. Various combinations of carrier gases and/or reaction gases can be used in the methods of the present invention.

The resultant layer therefore can be an oxide, sulfide, nitride, selenide, telluride, etc., or mixtures thereof, for example. Preferably, the layer formed is an oxide layer. A layer can be deposited in a wide variety of thicknesses, depending on the desired use. Preferably, the oxide layer formed can be used as the dielectric material (e.g., ferroelectric material) between the plates (i.e., electrodes) in memory devices, such as ferroelectric memory devices.

Preferably, the complexes of Formula I include a low valent metal (e.g., those from Groups IA and IIA). More preferably, the complexes of Formula I include a metal selected from the group of the Group IA metals (i.e., Group 1 or alkali metals), the Group IIA metals (i.e., Group 2 or alkaline earth metals), the Group IVB metals (i.e., Group 4 or titanium group metals), the Group VA metals (i.e., Group 15 or Bi) and the Group VB metals (i.e., Group 5 or vanadium group metals). More preferably, the complexes include a metal selected from the group of Ba, Sr, Ti, Nb, and Ta. Particularly preferred metals M include Ba and Sr.

Each L group is independently a neutral ligand containing one or more Lewis-base donor atoms. Preferably, the neutral ligand L of Formula I is selected from the group of polyamines, polyethers, aminoalcohols, ether-alcohols, and the like. More preferably, the neutral ligand is selected from the group of alkyl-substituted polyamines. Examples of such ligands include N,N,N',N",N"-pentamethyldiethylenetriamine (($CH_3$)$_2$$NCH_2CH_2N(CH_3)$$CH_2CH_2N(CH_3)_2$), N,N,N',N'-tetramethylethylenediamine (($CH_3$)$_2NCH_2CH_2N(CH_3)_2$), and N,N,N'-triethylethylenediamine (($CH_3CH_2$)$_2NCH_2CH_2N(H)$ ($CH_2CH_3$)). Various combinations of such L groups can be present in a complex. It is further required that there are at least two different L groups present in a precursor mixture, whether they be in the same complex (e.g., $L'_xL''_{y-x}MY_z$ or different complexes (e.g. $L'_yMY_z$ plus $L''_yMY_z$).

Each Y group is independently an anionic ligand. Preferably, the anionic ligand Y of Formula I is selected from the group of carboxylates, ketoiminates, amidinates, diketonates, diiminates, and the like. More preferably, the anionic ligand is selected from the group of diketonates and ketoiminates. Examples of such ligands include 2,2-dimethylhexane-3,5-dionate ($CH_3C(O)CHC(O)C(CH_3)_3$), 2,2,4,4-tetramethylheptane-3,5-dionate, 2,2-dimethyl-5-N-methylimino-3hexanoate (($CH_3N=C(CH_3)CH_2C(O)C$ ($CH_3$)$_3$. Various combinations of such Y groups can be present in a complex.

The complexes of Formula I of the present invention can be prepared by admixing two or more different ligands L with a metal complex $MY_z$, yielding adducts of the form $L'_xL''_{y-x}MY_z$ or mixtures of different adducts of the form $L'_yMY_z$ plus $L''_yMY_z$.

Various combinations of the compounds described herein can be used in a precursor composition for chemical vapor deposition. Thus, as used herein, a "precursor composition" refers to a liquid or melt that includes two or more complexes of Formula I. The precursor composition can also include one or more solvents suitable for use in a chemical vapor deposition system, as well as other additives, such as free ligands, that assist in the vaporization of the desired compounds.

Suitable solvents for use in the precursor compositions of the present invention include those that are not detrimental to the substrate or layers thereon. Examples of the solvents that are suitable for this application can be one or more of the following: aliphatic hydrocarbons or unsaturated hydrocarbons (preferably $C_3$–$C_{20}$, and more preferably $C_5$–$C_{10}$, cyclic, branched, or linear), aromatic hydrocarbons (preferably $C_5$–$C_{20}$, and more preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. The complexes are also generally compatible with each other, so that mixtures of variable quantities of the complexes will not interact to significantly change their physical properties.

Preferably, complexes of Formula I include, for example, the mixture $Sr[CH_3C(O)CHC(O)C(CH_3)_3]_2[(CH_3)_2NCH_2CH_2N(CH_3)CH_2CH_2N(CH_3)_2]$ plus $Sr[CH_3C(O)CHC(O)C(CH_3)_3]_2[(CH_3)_2NCH_2CH_2N(CH_3)_2]_2$.

As stated above, the use of the complexes of Formula I and methods of forming layers, particularly oxide layers, of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a layer formed from the complexes of the present invention would be useful is the ferroelectric memory cell 10 of FIG. 1. The memory cell 10 includes a ferroelectric material 11, which is prepared by depositing one or more of the complexes discussed herein using chemical vapor techniques, between two electrodes 12 and 13, which are typically made of platinum, although other metals such as gold or aluminum can also be used. The bottom electrode 13 is typically in contact with a silicon-containing layer 14, such as an n-type or p-type silicon substrate, silicon dioxide, glass, etc. A conductive barrier layer 15 is positioned between the bottom electrode 13 and the silicon-containing layer 14 to act as a barrier layer to diffusion of atoms such as silicon into the electrode and ferroelectric material.

Methods of the present invention can be used to deposit a metal-containing layer, preferably an oxide layer, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The layer is deposited upon decomposition (typically, thermal decomposition) of metal complexes, preferably that are either volatile liquids. Preferably, however, solvents are not used; rather, the transition metal complexes are liquid and used neat. Methods of the present invention preferably utilize vapor deposition techniques, such as flash vaporization, bubbling, microdroplet formation etc., or combinations thereof.

Figure 2:
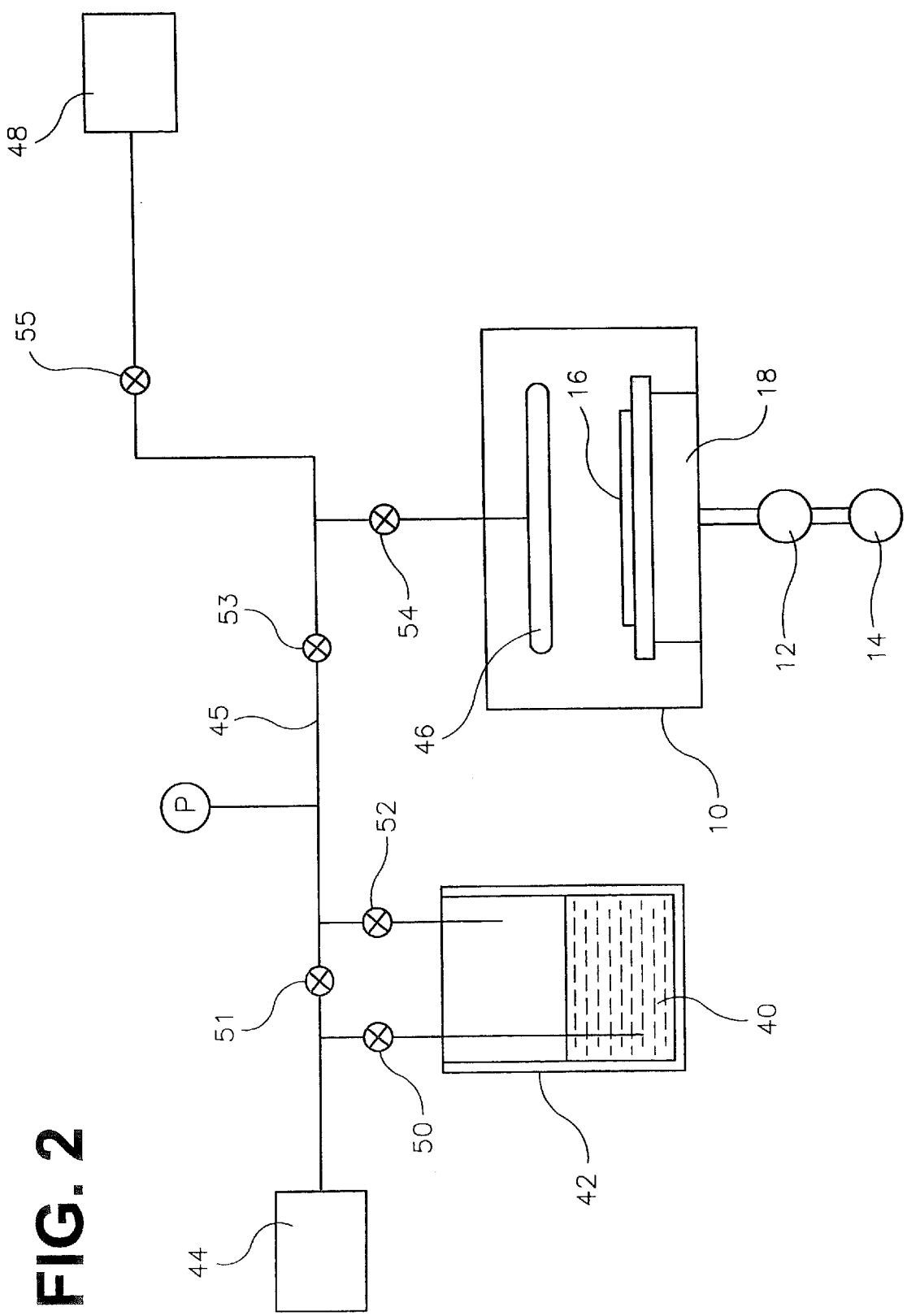
FIG. 2 is a perspective view of a chemical vapor deposition coating system suitable for use in the method of the present invention.

A typical chemical vapor deposition (CVD) system that can be used to perform the process of the present invention is shown in FIG. 2. The system includes an enclosed chemical vapor deposition chamber 10, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 600° C., and more preferably at a temperature of about 200° C. to about 400° C. Substrate 16 may be heated, for example, by an electrical resistance heater 18 on which substrate 16 is mounted. Other known methods of heating the substrate may also be utilized.

In this process, the precursor composition 40, which contains two or more complexes of Formula I, is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. As shown, a series of valves 50–55 are opened and closed as required.

Generally, the precursor composition is pumped into the CVD chamber 10 at a flow rate of about 1 sccm (standard cubic centimeters) to about 1000 sccm. The semiconductor substrate is exposed to the precursor composition at pressure of about 0.001 torr to about 100 torr for a time of about 0.01 minute to about 100 minutes. In chamber 10, the precursor composition will form an adsorbed layer on the surface of the substrate 16. As the deposition rate is temperature dependent, increasing the temperature of the substrate will increase the rate of deposition. Typical deposition rates are about 10 Angstroms/minute to about 1000 Angstroms/minute. The carrier gas containing the precursor composition is terminated by closing valve 53.

Figure 3:
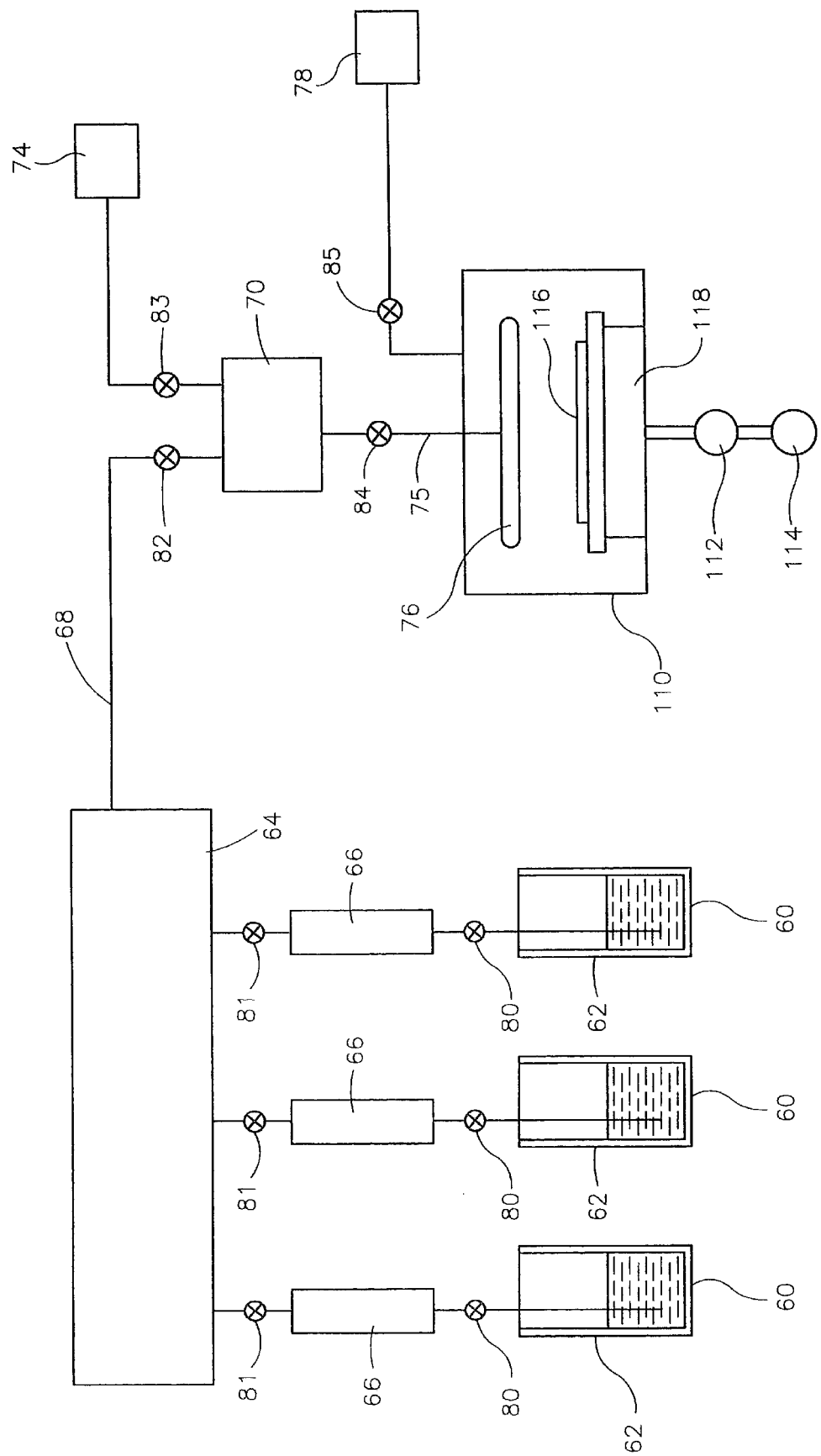
FIG. 3 is a perspective view of an alternative chemical vapor deposition coating system suitable for use in the method of the present invention.

An alternative CVD system that can be used to perform the process of the present invention is shown in FIG. 3. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 2 (for example, by an electrical resistance heater 118).

In this process, one or more solutions 60 of one or more metal precursor complexes (and/or other metal or metalloid complexes), are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Reaction gas may be supplied from source 78 as needed. As shown, a series of valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (typically in the form of a neat liquid) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIGS. 2–3, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

The following examples are offered to further illustrate the various specific and preferred embodiments and techniques. It should be understood, however, that many variations and modifications may be made while remaining within the scope of the present invention.

EXAMPLES

All experiments are carried out using standard inert gas techniques.

Example 1

$\{Ba(thd)_2(Me_2NCH_2CH_2N(Me)CH_2CH_2NMe_2)+Ba(thd)_2[Me(OCH_2CH_2)_4OMe]+Ba(thd)_2(Me_2NCH_2CH_2NMe_2)_2\}$ The mixture of these three compounds is made by partially dissolving 20 g (10 mmol) of $[Ba(thd)_2]_4$ (Chemat Technology, Inc., Northridge, Calif.) in 100 mL of pentane ("thd"=2,2,6,6-tetramethylheptane-3,5-dionate), and adding to this 2.8 mL (13.4 mmol) of N,N,N'N',N"-pentamethyldiethylenetriamine (Aldrich Chemical Co., Milwaukee, Wis.), 3.0 mL (13.4 mmol) of tetra(ethylene glycol) dimethyl ether (Aldrich Chemical Co., Milwaukee, Wis.) and 4.0 mL (26.8 mmol) of N,N,N',N'-tetramethylethylenediamine (Aldrich Chemical Co., Milwaukee Wis.). The pentane is removed with a rotary evaporator, leaving a colorless liquid of the product mixture.

Example 2

$\{Sr(thd)_2(Me_2NCH_2CH_2N(Me)CH_2CH_2NMe_2)+Sr(thd)_2[Me(OCH_2CH_2)_4OMe]+Sr(thd)_2(Me_2NCH_2CH_2NMe_2)_2\}$ The mixture of these three compounds is made in similar fashion to that described above for the barium analogues. The starting material for this preparation is $[Sr(thd)_2]_3$ (13.6 g; 10 mmol). Removal of the pentane solvent yields a colorless liquid of the product mixture.

Example 3

Chemical Vapor Deposition of $(Ba,Sr)TiO_3$

A precursor mixture is prepared which contains Ba and Sr precursors (prepared as described above) and a solution of $Ti(OiPr)_2(thd)_2$ in tetrahydrofuran. The Ba and Sr precursors are miscible with the Ti solution, yielding a colorless precursor mixture. The mixture is pumped into a heated (250° C.) evaporator where all components of the mixture are vaporized and where carrier gas (He, at 500 sccm) transports the vapor to a CVD chamber through a heated conduit (260° C.). Inside the chamber, the vapor contacts a silicon wafer that is heated to 400–650° C. This temperature along with an oxidizing gas ($O_2$ and/or $N_2O$) provided separately causes the precursor vapor to deposit as the desired $(Ba,Sr)TiO_3$ film. The stoichiometry of the film is found to be controlled by the original precursor concentrations as well as oxidizer concentration, chamber pressure and substrate temperature. Film thickness is controlled by deposition time (exposure time).

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure comprising:
   providing a semiconductor substrate or substrate assembly;
   providing a precursor composition comprising two or more miscible liquid complexes of the formula:

$L_yMY_z$ wherein:
   M is a metal;
   each L group is independently a neutral ligand containing one or more Lewis-base donor atoms;
   each Y group is independently an anionic ligand;
   y=a nonzero integer; and
   z=a nonzero integer corresponding to the valence state of the metal; and further wherein there are at least two different L groups present in the precursor composition; and
   vaporizing the precursor composition and directing it toward the semiconductor substrate or substrate assembly to form a metal-containing layer on a surface of the semiconductor substrate or substrate assembly.

2. The method of claim 1 wherein the precursor composition is vaporized in the presence of a carrier gas.

3. The method of claim 2 wherein the precursor composition is vaporized in the presence of a reaction gas.

4. The method of claim 3 wherein:
   the carrier gas is selected from the group consisting of nitrogen, helium, argon, and mixtures thereof; and
   the reaction gas is selected from the group consisting of oxygen, ozone, nitrogen oxides, ammonia, hydrazine, water vapor, hydrogen sulfide, hydrogen selenide, hydrogen telluride, and mixtures thereof.

5. The method of claim 4 wherein the layer is a layer of an oxide, sulfide, nitride, selenide, telluride, or mixture thereof.

6. The method of claim 1 wherein the layer is an oxide layer and forms a dielectric layer.

7. The method of claim 1 wherein the precursor composition further includes one or more solvents.

8. The method of claim 1 wherein vaporizing the precursor composition comprises using a chemical vapor deposition technique comprising flash vaporization, bubbling, microdroplet formation, or combinations thereof.

9. The method of claim 1 wherein the metal is selected from the group of the Group IA metals, Group IIA metals, the Group IVB metals, the Group VA metals, and the Group VB metals.

10. The method of claim 9 wherein the metal is selected from the group of Ba, Sr, and mixtures thereof.

11. The method of claim 1 wherein the Lewis-base donor atoms are selected from the group of O, S, N, P, As, Se, and halogen.

12. The method of claim 1 wherein the at least two different L groups present in the precursor composition are present in the same complex.

13. The method of claim 1 wherein the at least two different L groups present in the precursor composition are present in different complexes.

14. The method of claim 1 wherein the neutral ligand L is selected from the group of polyamines, polyethers, aminoalcohols, ether-alcohols, and mixtures thereof.

15. The method of claim 1 wherein the anionic ligand Y is selected from the group of carboxylates, ketoiminates, amidinates, diketonates, diiminates, and mixtures thereof.

16. A method of manufacturing a semiconductor structure comprising:
   providing a semiconductor substrate or substrate assembly;
   providing a precursor composition comprising two or more miscible liquid complexes of the formula:

$L_yMY_z$ wherein:
   M is a metal selected from the group of the Group IA metals, Group IIA metals, the Group IVB metals, the Group VA metals, and the Group VB metals;
   each L group is independently a neutral ligand selected from the group of polyamines, polyethers, aminoalcohols, ether-alcohols, and mixtures thereof;
   each Y group is independently an anionic ligand selected from the group of carboxylates, ketoiminates, amidinates, diketonates, diiminates, and mixtures thereof;
   y=a nonzero integer; and
   z=a nonzero integer corresponding to the valence state of the metal; and further wherein there are at least two different L groups present in the precursor composition; and
   vaporizing the precursor composition and directing it toward the semiconductor substrate or substrate assembly to form a metal-containing layer on a surface of the semiconductor substrate or substrate assembly.

17. A method of manufacturing a memory device structure comprising:
   providing a substrate having a first electrode thereon;
   providing a precursor composition comprising two or more miscible liquid complexes of the formula:

$L_yMY_z$ wherein:
   M is a metal;
   each L group is independently a neutral ligand containing one or more Lewis-base donor atoms;
   each Y group is independently an anionic ligand;
   y=a nonzero integer; and
   z=a nonzero integer corresponding to the valence state of the metal; and further wherein there are at least two different L groups present in the precursor composition;
   vaporizing the precursor composition and directing it toward the substrate to form a dielectric layer comprising an oxide layer on the first electrode of the substrate; and
   forming a second electrode on the dielectric layer.

18. The method of claim 17 wherein the substrate is a silicon wafer.

19. The method of claim 17 wherein the oxide layer forms a ferroelectric layer.

20. A method of manufacturing a memory device structure comprising:
   providing a substrate having a first electrode thereon;
   providing a precursor composition comprising two or more miscible liquid complexes of the formula:

$$L_yMY_z$$

wherein:
      M is a metal selected from the group of the Group IA metals, Group IIA metals, the Group IVB metals, the Group VA metals, and the Group VB metals;
      each L group is independently a neutral ligand selected from the group of polyamines, polyethers, aminoalcohols, ether-alcohols, and mixtures thereof;
      each Y group is independently an anionic ligand selected from the group of carboxylates, ketoiminates, amidinates, diketonates, diiminates, and mixtures thereof;
      y=a nonzero integer; and
      z=a nonzero integer corresponding to the valence state of the metal; and further wherein there are at least two different L groups present in the precursor composition;
   vaporizing the precursor composition and directing it toward the substrate to form a dielectric layer comprising an oxide layer on the first electrode of the substrate; and
   forming a second electrode on the dielectric layer.

21. A method of forming a layer on a substrate comprising:
   providing a substrate;
   providing a precursor composition comprising two or more miscible liquid complexes of the formula:

$$L_yMY_z$$

wherein:
      M is a metal;
      each L group is independently a neutral ligand containing one or more Lewis-base donor atoms;
      each Y group is independently an anionic ligand;
      y=a nonzero integer; and
      z=a nonzero integer corresponding to the valence state of the metal; and further wherein there are at least two different L groups present in the precursor composition; and
   vaporizing the precursor composition and directing it toward the substrate to form a metal-containing layer on the substrate.

22. The method of claim 21 wherein the layer is a layer of an oxide, sulfide, nitride, selenide, telluride, or mixture thereof.

23. The method of claim 22 wherein the layer is an oxide layer.

24. The method of claim 23 wherein the oxide layer forms a ferroelectric layer in a ferroelectric memory device.

25. The method of claim 24 wherein the substrate comprises a silicon substrate.

26. A method of forming a layer on a substrate comprising:
   providing a substrate;
   providing a precursor composition comprising two or more miscible liquid complexes of the formula:

$$L_yMY_z$$

wherein:
      M is a metal selected from the group of the Group IA metals, Group IIA metals, the Group IVB metals, the Group VA metals, and the Group VB metals;
      each L group is independently a neutral ligand selected from the group of polyamines, polyethers, aminoalcohols, ether-alcohols, and mixtures thereof;
      each Y group is independently an anionic ligand selected from the group of carboxylates, ketoiminates, amidinates, diketonates, diiminates, and mixtures thereof;
      y=a nonzero integer; and
      z=a nonzero integer corresponding to the valence state of the metal; and further wherein there are at least two different L groups present in the precursor composition; and
   vaporizing the precursor composition and directing it toward the substrate to form a metal-containing layer on the substrate.

27. A chemical vapor deposition precursor composition comprising two or more miscible liquid complexes of the formula:

$$L_yMY_z$$

wherein:
      M is a metal;
      each L group is independently a neutral ligand containing one or more Lewis-base donor atoms;
      each Y group is independently an anionic ligand;
      y=a nonzero integer; and
      z=a nonzero integer corresponding to the valence state of the metal; and
   further wherein there are at least two different L groups present in the precursor composition.

28. A chemical vapor deposition precursor composition comprising two or more miscible liquid complexes of the formula:

$$L_yMY_z$$

wherein:
      M is a metal selected from the group of the Group IA metals, Group IIA metals, the Group IVB metals, the Group VA metals, and the Group VB metals;
      each L group is independently a neutral ligand selected from the group of polyamines, polyethers, aminoalcohols, ether-alcohols, and mixtures thereof;
      each Y group is independently an anionic ligand selected from the group of carboxylates, ketoiminates, amidinates, diketonates, diiminates, and mixtures thereof;
      y=a nonzero integer; and
      z=a nonzero integer corresponding to the valence state of the metal; and
   further wherein there are at least two different L groups present in the precursor composition.

* * * * *